United States Patent
Cui et al.

(10) Patent No.: US 8,797,099 B2
(45) Date of Patent: Aug. 5, 2014

(54) POWER AMPLIFIER DEVICE AND POWER AMPLIFIER CIRCUIT THEREOF

(75) Inventors: Xiaojun Cui, Shenzhen (CN); Huazhang Chen, Shenzhen (CN); Jinyuan An, Shenzhen (CN); Jianli Liu, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 0 days.

(21) Appl. No.: 13/521,125

(22) PCT Filed: Oct. 28, 2011

(86) PCT No.: PCT/CN2011/081489
§ 371 (c)(1),
(2), (4) Date: Jul. 9, 2012

(87) PCT Pub. No.: WO2012/146016
PCT Pub. Date: Nov. 1, 2012

(65) Prior Publication Data
US 2014/0125415 A1    May 8, 2014

(30) Foreign Application Priority Data
Apr. 29, 2011    (CN) .......................... 2011 1 0111760

(51) Int. Cl.
*H03F 3/68*    (2006.01)
*H03F 3/21*    (2006.01)
*H03F 3/60*    (2006.01)
*H03F 1/02*    (2006.01)

(52) U.S. Cl.
CPC .......... *H03F 3/211* (2013.01); *H03F 2200/411* (2013.01); *H03F 3/602* (2013.01); *H03F 1/0288* (2013.01); *H03F 3/68* (2013.01)
USPC ....................................... 330/295; 330/124 R

(58) Field of Classification Search
CPC ......................................................... H03F 3/68
USPC ................................ 330/295, 124 R, 84, 126
See application file for complete search history.

(56) References Cited

U.S. PATENT DOCUMENTS

| 7,619,468 B1 | 11/2009 | Bowles et al. |
| 8,022,760 B2 * | 9/2011 | Gajadharsing et al. ... 330/124 R |

(Continued)

FOREIGN PATENT DOCUMENTS

| CN | 101589550 A | 11/2009 |
| CN | 102170271 A | 8/2011 |
| 8,035,444 | B2 * | 10/20Kubo et al. 330/124 R |

(Continued)

OTHER PUBLICATIONS

International Search Report for PCT/CN2011/081489 dated Jan. 11, 2012.

*Primary Examiner* — Henry Choe
(74) *Attorney, Agent, or Firm* — Ling Wu; Stephen Yang; Ling and Yang Intellectual Property

(57) ABSTRACT

The present invention relates to a power amplifier apparatus and power amplifier circuit, and the power amplifier circuit uses the Doherty circuit structure, and uses a high voltage heterojunction bipolar transistor (HVHBT) power amplifier to achieve a Carrier amplifier of the Doherty circuit structure, and uses lateral double-diffused metal oxide semiconductor (LDMOS) to achieve a Peak amplifier. The power amplifier apparatus and power amplifier circuit in the present invention improves the efficiency of the power amplifier.

10 Claims, 3 Drawing Sheets

Driver stage power amplifier circuit    Final stage power amplifier circuit

(56) References Cited

U.S. PATENT DOCUMENTS

| | | | |
|---|---|---|---|
| 8,188,789 B2 * | 5/2012 | Woo et al. | 330/124 R |
| 8,319,549 B2 * | 11/2012 | Sengupta et al. | 330/2 |
| 2008/0122542 A1 | 5/2008 | Bowles et al. | |
| 2009/0085667 A1 | 4/2009 | Krvavac | |
| 2013/0214866 A1 * | 8/2013 | He et al. | 330/295 |

FOREIGN PATENT DOCUMENTS

| | | |
|---|---|---|
| KR | 10-0760519 B1 | 9/2007 |
| WO | 2005031967 A1 | 4/2005 |

* cited by examiner

POWER AMPLIFIER DEVICE AND POWER AMPLIFIER CIRCUIT THEREOF

TECHNICAL FIELD

The present invention relates to the field of communications, and more especially, to a power amplifier apparatus and power amplifier circuit (including the final stage and the driver stages) in the field of communications.

BACKGROUND OF THE RELATED ART

In the face of increasingly fierce competition in the market, the efficiency of the base station products has become the focus of competition in the industry, and the improvement of the efficiency of the main component-power amplifier that determines the efficiency of the base station has become a top priority, and the industry has invested in research on the efficiency improvement technologies, and at present, the Doherty technology is a mature technology that is most widely used, and the power amplifier manufacturers have begun producing and applying the Doherty power amplifiers in mass, and how to further improve the efficiency in this technology is particularly important.

The Doherty technology was invented by W. H. Doherty in 1936, and it was originally used in traveling wave tubes to provide high power transmitters for broadcasting, and its structure is simple and highly efficient.

The conventional Doherty structure is composed of two power amplifiers: a main power amplifier (also called as the carrier power amplifier) and an auxiliary power amplifier (also known as Peak Power Amplifier), wherein the carrier power amplifier works in Class B or AB, and the peak power amplifier works in Class C. The two power amplifiers do not work in turns, but the carrier power amplifier works all the time, and the peak power amplifier only works when the preset peak is reached. The 90 degree—a quarter of wavelength line after the carrier power amplifier is for impedance transformation, and its purpose is to play the role of reducing the apparent impedance of the carrier power amplifier when the peak power amplifier works, thus to ensure that the active load impedance composed of the peak power amplifier and the subsequent circuits reduces when the peak power amplifier works, thus the output current of the carrier power amplifier is amplified. Due to the a quarter of wavelength line after the carrier power amplifier, in order to make the outputs of the two power amplifiers in phase, 90° phase shift is also needed before the peak power amplifier, as shown in FIG. 1.

The carrier power amplifier works in Class B, when the input signal is relatively small, only the carrier power amplifier is in working condition; when the output voltage of the tube reaches the peak saturation point, the efficiency can reach 78.5% in theory. If the excitation is doubled at this time, the tube is already saturated when a half of the peak value is reached, and the efficiency also reaches the maximum 78.5%, at this time, the peak power amplifier also begins to work together with the carrier power amplifier. The introduction of the peak power amplifier makes the load reduced from the perspective of the carrier power amplifier, and since the function of peak power amplifier for the load is equivalent to be series with one negative impedance, even if the output voltage of the carrier power amplifier is saturated and constant, the output power continues to increase (the current flowing through the load is larger) due to the reduction of load. When the excitation peak is reached, the peak power amplifier also reaches the maximum point of its own efficiency, and the total efficiency of two power amplifiers is much higher than the efficiency of a single power amplifier in class B. The maximum efficiency 78.5% of a single power amplifier in class B appears at the peak value, but currently the efficiency 78.5% appears at a half of the peak value, so this system architecture can reach to a very high efficiency (each amplifier reaches its maximum output efficiency).

Due to the requirements of the base station system on set-top output power, the gain of RF power amplifier needs to be in the dozens of dB, thus one stage amplification is not enough, generally 3-4 stage amplification is needed, that is, the pre-driver, the driver and the final stage. Currently, the link structure commonly used in the industry is as follows: the pre-driver stage uses the RF small-signal amplifier, and its working mode is CLASS A; the driver and final stages use the same type of RF power amplifiers (currently, the industry uses the LDMOS devices), the working mode of the driver stage is CLASS AB, and the final stage is the Doherty structure.

With the industry's green concept being put forward, the requirements of the operators on the efficiency of the communication system is almost harsh, even with the advanced Doherty technology, the efficiency of power amplifier is still unable to meet their increasing demands, therefore it is necessary to make continuous improvements on the basis of the Doherty technology to achieve the continuous improvement of efficiency.

In the traditional RF power amplifier, the Doherty structure is only applied to the final stage, and the driver stage and the final stage use the same type of power amplifiers, whose advantages are that: the supply voltages and the bias mode are the same, thus the design of the bias circuit is simple; since the amplifiers are of the same type, the discretion of the mass production is relatively easy to be controlled. However, a fact that cannot be ignored is that: the industry's leading LDMOS device has been developed to the eighth generation, and its cost is low, but its performance has very limited room for improvement, which cannot meet the environmental protection requirements; in addition, although the efficiency of power amplifier is primarily determined by the final stage, the final stage provides 90% of the operating current, thus further enhancing the efficiency of the final stage has great significance, but the 10% provided by the driver stage cannot be ignored increasingly, therefore, it also needs to improve the circuit of the driver stage.

From the signal power spectrum distribution of different standards of the current communication systems, the 70%-80% energy output by the power amplifier is concentrated near the average power, that is, most of the operating current of the final stage power amplifier using the Doherty technology is provided by the Carrier amplifier, thus enhancing the efficiency of the Carrier amplifier of the final stage has great significance in improving the efficiency of the entire power amplifier. Meanwhile, further enhancing the efficiency of the driver stage can also better realize the efficiency improvement of the entire power amplifier.

SUMMARY OF THE INVENTION

The technical problem to be solved in the present invention is to provide a power amplifier apparatus and a power amplifier circuit to solve the problem that the efficiency of a power amplifier cannot meet the requirements.

To solve the above technical problem, the present invention provides a power amplifier apparatus, the apparatus comprises one or more driver stage power amplifier circuits in a series connection and a final stage power amplifier circuit connecting with the output end of the last one driver stage power amplifier circuit, and the driver stage power amplifier circuit uses the Doherty circuit structure.

Preferably, the Doherty circuit structure comprises a power divider sub-circuit, one carrier amplifier and at least one peak amplifier connecting with the output end of the power divider sub-circuit, as well as a power combiner sub-circuit connecting with the output ends of the carrier amplifier and the peak amplifier.

Preferably, both the carrier amplifier and the peak amplifier use Lateral double-diffused metal-oxide semiconductor (LDMOS) power amplifiers, alternatively, the carrier amplifier uses a High Voltage Heterojunction Bipolar Transistor (HVHBT), and the peak amplifier uses the Lateral double-diffused metal-oxide semiconductor (LDMOS).

Preferably, the final stage power amplifier circuit uses the High Voltage Heterojunction Bipolar Transistor (HVHBT) power amplifiers to achieve the function of the Carrier power amplifier and the LDMOS power amplifiers to achieve the function of the Peak power amplifier.

To solve the above technical problem, the present invention provides a driver stage power amplifier circuit of the power amplifier apparatus, and the driver stage circuit comprises:

a power divider sub-circuit;

one carrier amplifier and at least one peak amplifier connecting with the output end of the power divider sub-circuit;

a power combiner sub-circuit connecting with the output ends of the carrier amplifier and the peak amplifier.

Preferably, both the carrier amplifier and the peak amplifier use Lateral double-diffused metal-oxide semiconductor (LDMOS) power amplifiers, alternatively, the carrier amplifier uses a High Voltage Heterojunction Bipolar Transistor (HVHBT) power amplifier, and the peak amplifier uses the Lateral double-diffused metal-oxide semiconductor (LDMOS) power amplifier.

To solve the above technical problem, the present invention provides a power amplifier circuit of the power amplifier apparatus, and the power amplifier circuit uses the Doherty circuit structure, and it uses the High Voltage Heterojunction Bipolar Transistor (HVHBT) power amplifier to achieve the Carrier amplifier of the Doherty circuit structure and the Lateral double-diffused metal-oxide semiconductor (LDMOS) to achieve the Peak amplifier.

Preferably, the power amplifier circuit is the driver stage or the final stage of the power amplifier apparatus.

To solve the above technical problem, the present invention provides another power amplifier circuit of the power amplifier apparatus, and the power amplifier circuit comprises:

a power divider sub-circuit;

a carrier amplifier connecting with the output end of the power divider sub-circuit, and the carrier amplifier is achieved with a high voltage heterojunction bipolar transistor (HVHBT) power amplifier;

at least one peak amplifier connecting with the output end of the power divider sub-circuit, and the peak amplifier is implemented with a Lateral double-diffused metal-oxide semiconductor (LDMOS) power amplifier; and a power combiner sub-circuit connecting with the output ends of the carrier amplifier and the peak amplifier.

Preferably, the power amplifier circuit is the driver stage or the final stage of the power amplifier apparatus.

The power amplifier apparatus and the power amplifier circuit in the present invention use the Doherty technology and provide a new combination of the Carrier amplifier and the Peak amplifier, and compared to the related art, it can improve the efficiency of the power amplifier.

PREFERRED EMBODIMENTS OF THE PRESENT INVENTION

The power amplifier apparatus of the present invention uses the high efficient Doherty circuit structure in the driver stage power amplifier circuit, thus improving the efficiency of the power amplifier apparatus.

The power amplifier apparatus of the present invention comprises one or more driver stage power amplifier circuits in a series connection, as well as the final stage power amplifier circuit connecting with the output end of the last one driver stage power amplifier circuit, in particular, the driver stage power amplifier circuit in the present invention uses the Doherty circuit structure.

Figure 2:
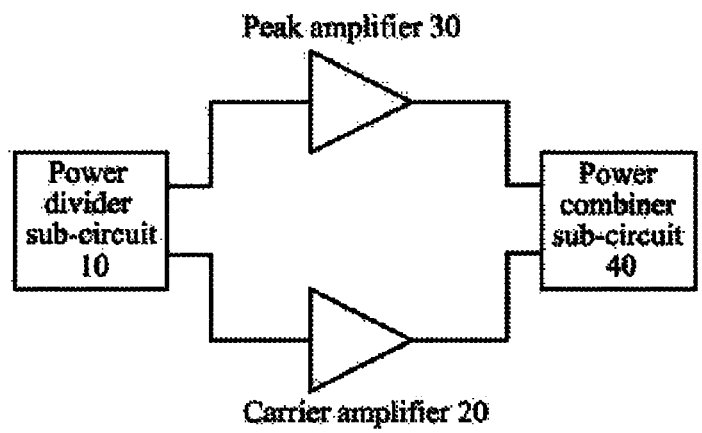
FIG. 2 is a schematic diagram of the Doherty circuit structure.

Specifically, as shown in FIG. 2, the Doherty circuit structure comprises: the power divider sub-circuit 10, one main amplifier 20 and at least one auxiliary amplifier 30 connecting with the output end of the power divider sub-circuit 10, as well as the power combiner sub-circuit 40 connecting to the output ends of the main amplifier and the auxiliary amplifier.

Figure 1:
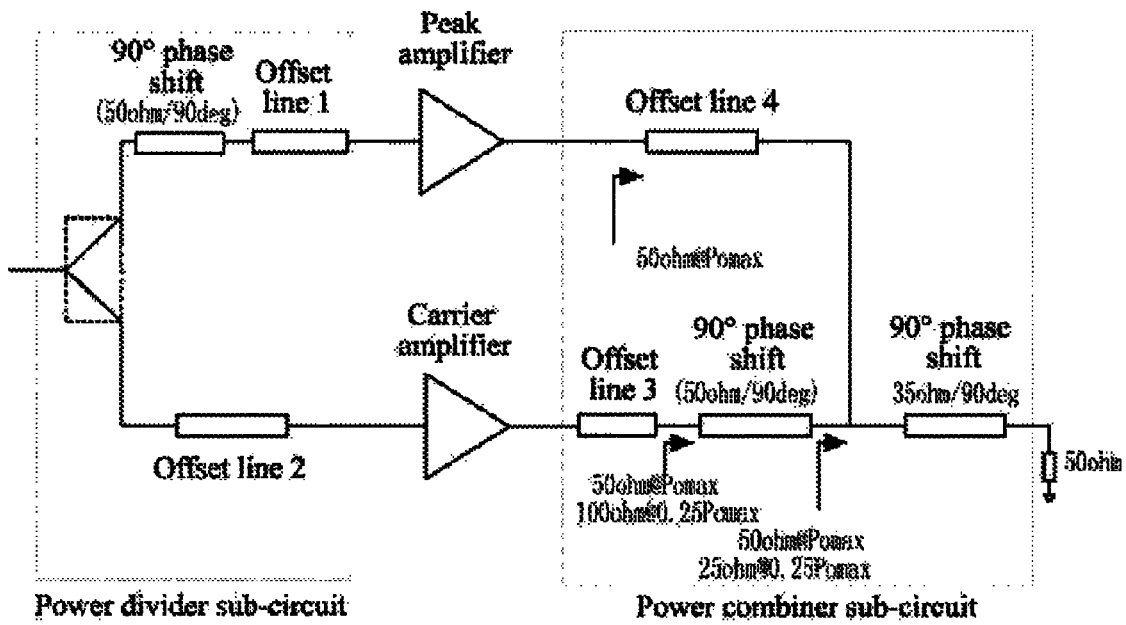
FIG. 1 is a block diagram of a conventional Doherty power amplifier.

Understandably, the main amplifier 20, also known as the Carrier amplifier, provides the function of main power amplifier, such as continuing to provide power amplification. The auxiliary amplifier, also known as the Peak amplifier, provides the function of auxiliary power amplifier, for example, it only works under certain conditions (for example, when the preset peak is achieved). As shown in FIG. 1, the power divider sub-circuit 10 comprises a series of functional devices such as the power divider, the 90 degree—a quarter of wavelength line, and the phase offset line and so on, and the power combiner sub-circuit 40 comprises a series of functional devices such as the 90 degree—a quarter of wavelength line, the phase offset line, and the impedance transformer and so on; the specific device type, model and connection relationship are designed, selected and matched according to specific requirements and are not limited in the present invention.

The carrier amplifier and the peak amplifier can be achieved with various types of power amplifiers, preferably with the lateral double-diffused metal oxide semiconductor (LDMOS), alternatively, the carrier amplifier uses the high voltage heterojunction bipolar transistor (HVHBT) and the peak amplifier uses the LDMOS power amplifier.

The HVHBT is a HBT processing device that is able to work under high voltage, and the high voltage refers to an operating voltage above 12V. It comprises but not limited to the Tripower series power amplifier devices from the U.S. Triquint company.

In the related art, the final stage power amplifier circuit is also implemented with the Doherty structure circuit shown in FIG. 2, preferably, the high voltage heterojunction bipolar transistor (HVHBT) amplifier is utilized to achieve the function of main power amplifier, and the LDMOS power amplifier is utilized to achieve the function of auxiliary power amplifier.

In the following, the embodiments of the present invention will be described in detail with combination of the accompanying drawings. It should be noted that without conflict, the embodiments and the features of the embodiments in this application can be combined with each other.

The First Embodiment

Figure 3:
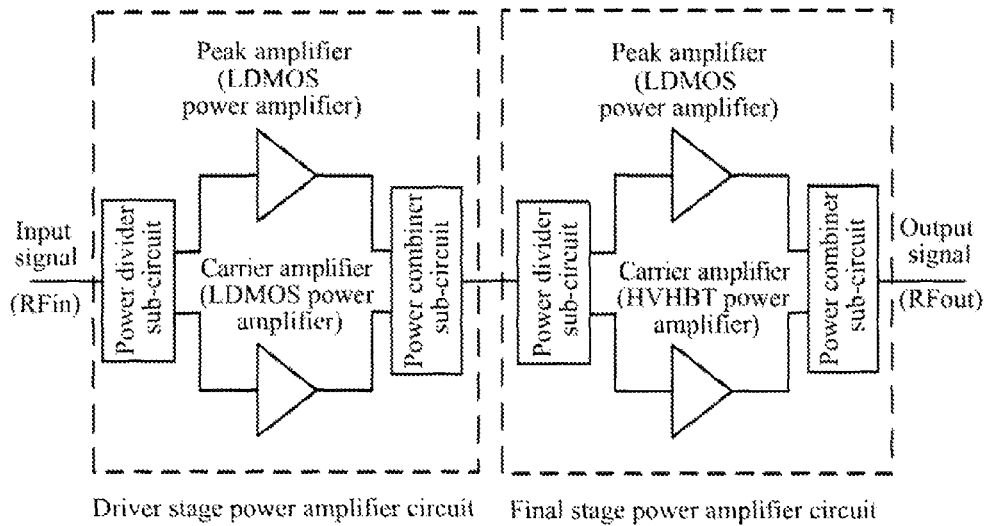
FIG. 3 is a schematic diagram of a first embodiment of the present invention.

The first embodiment of the power amplifier apparatus is shown in FIG. 3, and the driver stage in this embodiment uses a two-path Doherty structural circuit and uses the LDMOS power amplifiers to achieve the functions of the main power amplifier and auxiliary power amplifier, and the final stage uses the two-path Doherty structural circuit and uses the HVHBT power amplifier to achieve the function of main power amplifier and uses the LDMOS power amplifier to realize the function of auxiliary power amplifier.

Specifically, the driver stage amplification part is achieved with the Doherty circuit structure, and its Carrier amplifier and Peak amplifier use the Lateral double-diffused metal-oxide semiconductor (LDMOS, based on Si) power amplifiers.

At the same time when applying the Doherty circuit in the driver stage, the final stage is also achieved with the newly combined two-path Doherty circuit structure.

For the final stage two-path Doherty structure (including the traditional two-path symmetrical Doherty, the asymmetric Doherty and so on) as well as the architecture of one Carrier plus one Peak evolved on this basis, the High Voltage Heterojunction Bipolar Transistor (HVHBT, based on the GaAs) power amplifier can be used as the Carrier amplifier while the LDMOS power amplifier is used as the Peak amplifier to achieve the efficiency improvement.

The Second Embodiment

Figure 4:
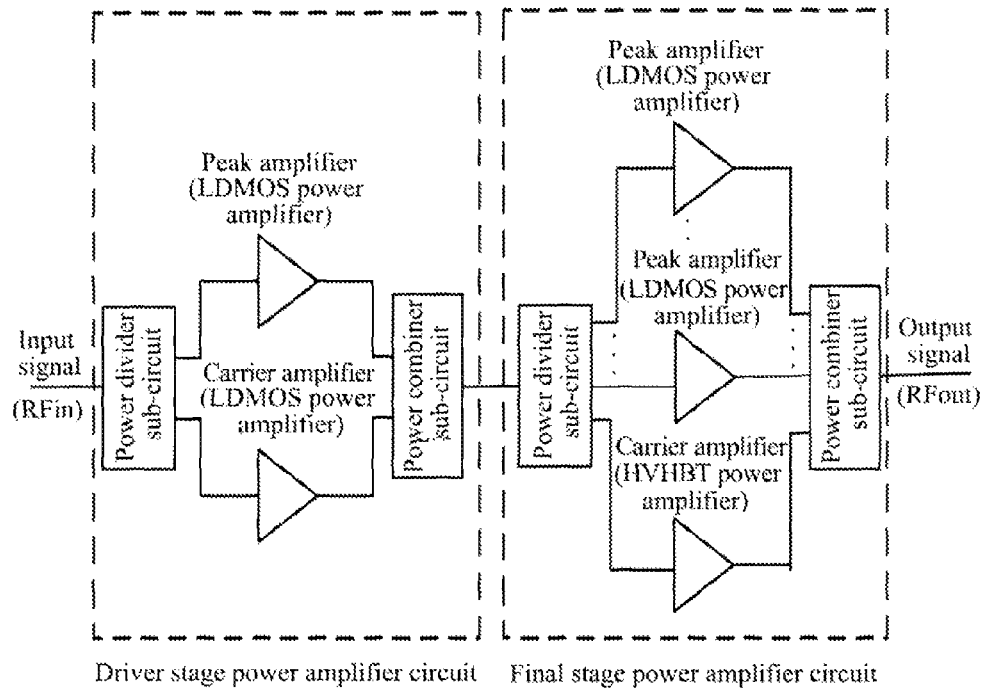
FIG. 4 is a schematic diagram of a second embodiment of the present invention.

The second embodiment of the power amplifier apparatus is shown in FIG. 4, and the driver stage in this embodiment uses the two-path Doherty structural circuit and uses the LDMOS power amplifiers to achieve the functions of the main power amplifier and auxiliary power amplifier, and the final stage uses the multi-path Doherty structural circuit and uses the HVHBT power amplifier to achieve the function of main power amplifier, and uses the LDMOS power amplifier to realize the function of auxiliary power amplifier.

Specifically, the driver stage amplification part is achieved with the Doherty circuit structure, and its Carrier amplifier and Peak amplifier use the LDMOS power amplifiers.

At the same time when using the Doherty circuit in the driver stage, the final stage also uses the newly combined multi-path Doherty circuit structure for implementation.

For the final stage multi-path Doherty structure as well as the architecture of one Carrier plus multiple Peaks evolved on the basis of the Doherty structure, the HVHBT power amplifier can be used as the Carrier amplifier and the LDMOS power amplifiers can be used as multiple Peak amplifiers to achieve the efficiency improvement.

The Third Embodiment

Figure 5:
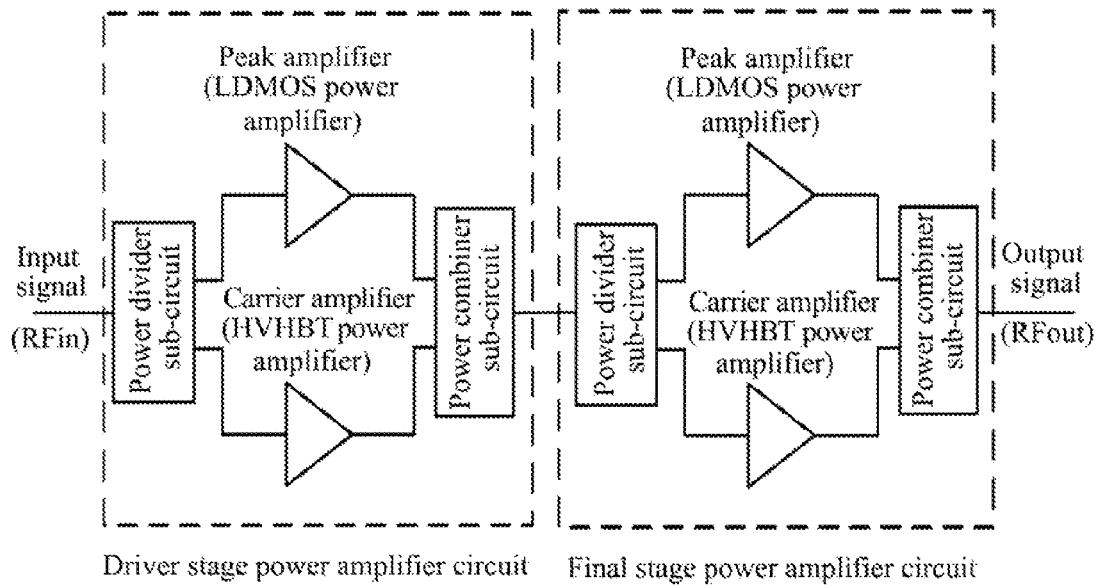
FIG. 5 is a schematic diagram of a third embodiment of the present invention.

The third embodiment of the power amplifier apparatus is shown in FIG. 5, the circuit structures of the third embodiment and the first embodiment are the same, and the difference is that the driver stage uses the HVHBT power amplifier as the Carrier amplifier and the LDMOS power amplifiers as the Peak amplifiers.

The Fourth Embodiment

Figure 6:
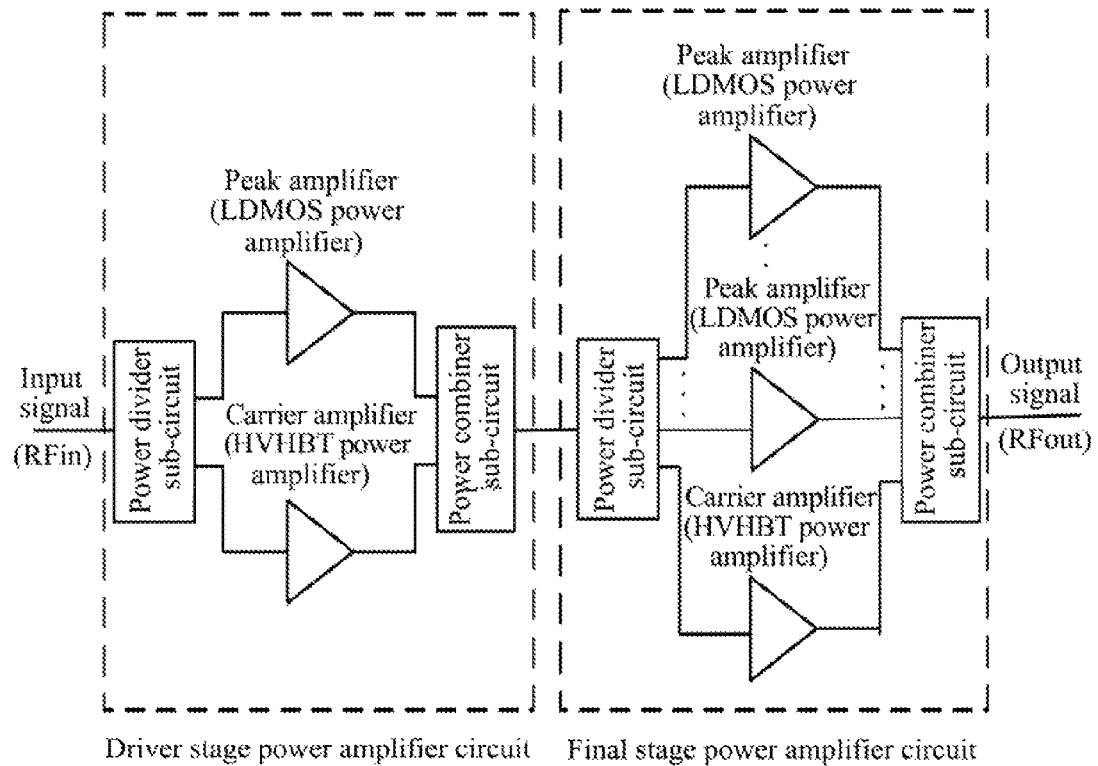
FIG. 6 is a schematic diagram of a fourth embodiment of the present invention.

The fourth embodiment of the power amplifier apparatus is shown in FIG. 6, the circuit structures of the fourth embodiment and the second embodiment are the same, and the difference is that the driver stage uses the HVHBT power amplifier as the Carrier amplifier and the LDMOS power amplifiers as the Peak amplifiers.

The key point of the present invention is that: the driver stage uses the high efficient Doherty circuit structure to raise the efficiency of the driver stage; meanwhile, the driver stage or the final stage also uses the breakthrough newly combined method, and the advantage such as high efficiency of the HVHBT power amplifier is fully utilized to act as the Carrier amplifier to improve the efficiency and achieve the optimal performance; moreover, with the advantages, such as the high maturity, low cost and the full range of device types, of the LDMOS power amplifier technology, it is used as the Peak amplifier to achieve the optimal cost and finally achieve the perfect combination of the performance and cost.

With the method and apparatus of the present invention, compared with the current driver stage using the CLASS AB mode and the final stage Carrier and Peak amplifiers using the LDMOS Doherty power amplifiers, the entire efficiency of power amplifier can be significantly improved;

the LDMOS device development is very mature, wherein there is a full range of types of power devices and their cost is low. The driver stage uses the LDMOS device+Doherty structure, which not only improves the efficiency and but also ensures the cost;

since the cost of the GaAs-HVHBT power amplifier is 2-3 times higher than the cost of the Si-LDMOS, compared with the final stage Doherty power amplifier whose Carrier and Peak amplifiers use the HVHBT, the final stage power amplifier part in the method and apparatus of the present invention can improve the performance and reduce the cost;

in addition, since the types of the current HVHBT products are few (only 1-2), it cannot achieve the power level requirements on the diversification of the base station products; while the LDMOS development is very mature, and the products from the manufacturers are more complete, and there are many types of products with different power levels, in the application, the LDMOS products with different model numbers can be used as the Peak amplifier according to different power levels, and the Peak amplifier can be flexibly combined with the Carrier amplifier which uses the HVHBT power amplifier, and it can be achieved with different Doherty structures (symmetric, asymmetric, multi-path and so on) according to requirements, thus not only the cost and performance are taken into account, but also the convenience and flexibility can be ensured.

The specific steps for implementing the power amplifier apparatus of the present invention comprise:

1. the model number of the HVHBT power amplifier used by the final stage Carrier amplifier is determined according to different implementation needs;

2. the used Doherty structures are compared, analyzed and determined according to different implementation needs;

3. the model number of the LDMOS power amplifier used by the final stage Peak amplifier is determined according to the different implementation needs;

4. according to the gain of the final stage, the model number of the HVHBT power amplifier or the LDMOS power amplifier used by the driver stage Carrier amplifier and the model number of the LDMOS power amplifier used by the driver stage Peak amplifier are determined;

5. the matching design of the final stage and driver stage amplifiers as well as the design of the power divider part and power combiner part in the block diagram are completed;

6. the design of the rest parts of the apparatus in the present invention is completed.

The specific example is as follows:

According to the 55 W Doherty power amplifier design of the 2.1 GHz UMTS system applications (PAR: 6 dB), it needs to use two amplifiers whose total saturation power should be at least 200 W to achieve the design of the final stage. With the combination of the existing devices from the power amplifier manufacturers, two 120 W LDMOS power amplifiers can be used for implementation through the symmetric Doherty structure, and in accordance with the industry's current device level, its single final stage power amplifier efficiency is about 52%; when the method based on the invention is used (the Carrier amplifier uses the 120 W HVHBT power amplifier and the Peak amplifier uses the 120 W LDMOS power amplifier), the single final stage power amplifier efficiency is about 57%, improving nearly 10%; two HVHBT power amplifiers are used for implementation, the single final stage power amplifier efficiency is about 57%, but its cost is at least three times higher than the cost when it is implemented with the method based on the present invention.

For the Doherty driver stage design, since the final stage uses at least 200 W saturation power, the gain of the current 2.1 GHz final stage power amplifier Doherty is about 16 dB, therefore, the driver stage can use two 10 W LDMOS power amplifiers to design the Doherty driver stage amplification part, therefore, compared with the original CLASS AB design, the driver stage efficiency can also be improved by about 20% (for example: the efficiency of using the CLASS AB to design the driver stage is 15%, and it can be up to 18% when using the Doherty design).

Therefore, with the method and apparatus of the present invention, the efficiency can be greatly improved on the premise of ensuring the cost.

In summary, the implementation of the present invention is simple, and its design and debugging are convenient and the cost is low. Within the working frequency band range of the Doherty power amplifier, its efficiency indicator can be greatly improved, and the apparatus can be widely used in the design of a variety of Doherty power amplifiers.

Correspondingly, the driver stage power amplifier circuit of the power amplifier apparatus might also be described as: the driver stage power amplifier circuit comprises:

the power divider sub-circuit 10;

one carrier amplifier 20 and at least one peak amplifier 30 connecting with the output end of the power divider sub-circuit;

the power combiner sub-circuit 40 connecting with the output ends of the carrier amplifier and the peak amplifier.

As the above description, preferably, the carrier amplifier and the peak amplifier of the driver stage power amplifier circuit use the lateral double-diffused metal oxide semiconductor (LDMOS) power amplifiers, alternatively, the carrier amplifier uses the high voltage heterojunction bipolar transistor (HVHBT) power amplifier and the peak amplifier uses the LDMOS power amplifier.

The present invention also provides another power amplifier circuit of the power amplifier apparatus, and the power amplifier circuit uses the Doherty circuit structure, and uses the HVHBT power amplifier to achieve the Carrier amplifier of the Doherty circuit structure and the LDMOS to achieve the Peak amplifier.

Specifically, the power amplifier circuit is the driver stage or final stage of the power amplifier apparatus, specifically comprising:

the power divider sub-circuit 10;

the carrier amplifier 20 connecting with the output end of the power divider sub-circuit, wherein the carrier power amplifier is achieved with a high voltage heterojunction bipolar transistor (HVHBT) power amplifier;

at least one peak amplifier 30 connecting with the output end of the power divider sub-circuit, wherein the peak amplifier is implemented with a lateral double-diffused metal oxide semiconductor (LDMOS) power amplifier; and the power combiner sub-circuit 40 connecting with the output ends of the carrier amplifier and the peak amplifier.

The above description uses the high efficient Doherty technology to implement the driver stage power amplifier circuit to improve the overall power amplifier efficiency of the power amplifier apparatus, moreover, the Carrier amplifier and the Peak amplifier are newly combined in the driver stage or final stage power amplifier using the Doherty technology, and the new combination architecture is used to improve the efficiency of the driver stage or final stage Carrier amplifier, thus to achieve the significant improvement of the overall Doherty power amplifier efficiency from two aspects.

INDUSTRIAL APPLICABILITY

The power amplifier apparatus and the power amplifier circuit in the embodiments of the present invention use the Doherty technology and provide a new combination of the Carrier amplifier and the Peak amplifier, and compared to the related art, it can enhance the efficiency of the power amplifier.

What is claimed is:

1. A power amplifier apparatus, comprising one or more driver stage power amplifier circuits in a series connection and a final stage power amplifier circuit connecting with an output end of last one driver stage power amplifier circuit, wherein the driver stage power amplifier circuit uses a Doherty circuit structure; wherein the apparatus is implemented in a following way:
determining a model number of a power amplifier used by a final stage carrier amplifier;
comparing, analyzing and determining a Doherty structure to be used;
determining a model number of a power amplifier used by a final stage peak amplifier;
according to gain of final stage, determining a model number of a power amplifier used by a driver stage carrier amplifier and a model number of a power amplifier used by a driver stage peak amplifier;
completing a matching design of power amplifiers of the final stage and driver stage and a design for parts of power divider and power combiner in a block diagram.

2. The power amplifier apparatus of claim 1, wherein the Doherty circuit structure comprises a power divider sub-circuit, one carrier amplifier and at least one peak amplifier connecting with an output end of the power divider sub-circuit, as well as a power combiner sub-circuit connecting with output ends of the carrier amplifier and the peak amplifier.

3. The power amplifier apparatus of claim 2, wherein both the carrier amplifier and the peak amplifier use Lateral double-diffused metal-oxide semiconductor (LDMOS), alternatively, the carrier amplifier uses High Voltage Heterojunction Bipolar Transistor (HVHBT), and the peak amplifier uses a Lateral double-diffused metal-oxide semiconductor (LDMOS) power amplifier.

4. The power amplifier apparatus of claim 1, wherein the final stage power amplifier circuit uses a HVHBT power amplifier to achieve function of main power amplifier and a LDMOS power amplifier to achieve function of auxiliary power amplifier.

5. The power amplifier apparatus of claim 2, wherein the power divider sub-circuit comprises a power divider, 90 degree—a quarter of wavelength line and a phase offset line.

6. The power amplifier apparatus of claim 2, wherein the power combiner sub-circuit comprises 90 degree—a quarter of wavelength line, a phase offset line and an impedance transformer.

7. The power amplifier apparatus of claim 1, wherein the driver stage power amplifier circuit uses a LDMOS power amplifier to implement a carrier amplifier and a peak amplifier of the Doherty circuit structure, and the final stage power amplifier circuit uses a HVHBT power amplifier to implement the carrier amplifier of the Doherty circuit structure and uses the LDMOS power amplifier to implement the peak amplifier, and the final stage power amplifier circuit is implemented by using a combined two-path Doherty circuit structure.

8. The power amplifier apparatus of claim 1, wherein the driver stage power amplifier circuit uses a LDMOS power amplifier to implement a carrier amplifier and a peak amplifier of the Doherty circuit structure, and the final stage power amplifier circuit uses a HVHBT power amplifier to implement the carrier amplifier of the Doherty circuit structure and uses a plurality of LDMOS power amplifiers to implement the peak amplifier, and the final stage power amplifier circuit is implemented by using a combined multi-path Doherty circuit structure.

9. The power amplifier apparatus of claim 1, wherein the driver stage power amplifier circuit uses a HVHBT power amplifier to implement a carrier amplifier and uses a LDMOS power amplifier to implement a peak amplifier, and the final stage power amplifier circuit uses the HVHBT power amplifier to implement the carrier amplifier of the Doherty circuit structure and uses the LDMOS power amplifier to implement the peak amplifier, and the final stage power amplifier circuit is implemented by using a combined two-path Doherty circuit structure.

10. The power amplifier apparatus of claim 1, wherein the driver stage power amplifier circuit uses a HVHBT power amplifier to implement a carrier amplifier and uses a LDMOS power amplifier to implement a peak amplifier, and the final stage power amplifier circuit uses the HVHBT power amplifier to implement the carrier amplifier of the Doherty circuit structure and uses a plurality of LDMOS power amplifiers to implement the peak amplifier, and the final stage power amplifier circuit is implemented by using a combined multi-path Doherty circuit structure.

* * * * *